(12) United States Patent
Kang et al.

(10) Patent No.: US 10,187,056 B2
(45) Date of Patent: Jan. 22, 2019

(54) DEVICE AND METHOD TO BREAK THE CURRENT IN POWER TRANSMISSION OR DISTRIBUTION SYSTEM

(71) Applicant: GE ENERGY POWER CONVERSION TECHNOLOGY LIMITED, Warwickshire (GB)

(72) Inventors: Pengju Kang, Yorktown heights, NY (US); Saijun Mao, ShangHai (CN); Fei Xu, Shanghai (CN); Wenqiang Yang, Shanghai (CN); Yingqi Zhang, Shanghai (CN); Pengcheng Zhu, Shanghai (CN)

(73) Assignee: GE ENERGY POWER CONVERSION TECHNOLOGY LIMITED, Warwickshire (GB)

( * ) Notice: Subject to any disclaimer, the term of this patent is extended or adjusted under 35 U.S.C. 154(b) by 884 days.

(21) Appl. No.: 14/283,333

(22) Filed: May 21, 2014

(65) Prior Publication Data

US 2014/0346891 A1 Nov. 27, 2014

(30) Foreign Application Priority Data

May 21, 2013 (CN) .......................... 2013 1 0188777

(51) Int. Cl.
 *H03K 17/687* (2006.01)
 *H02H 3/087* (2006.01)
 (Continued)

(52) U.S. Cl.
 CPC ......... *H03K 17/6871* (2013.01); *H01H 9/548* (2013.01); *H01H 33/596* (2013.01);
 (Continued)

(58) Field of Classification Search
 CPC ............. H03K 17/6871; H03K 17/122; H03K 17/725; H02H 3/087; H02H 3/08;
 (Continued)

(56) References Cited

U.S. PATENT DOCUMENTS

| 5,339,210 A | 8/1994 | Howell |
| 5,463,252 A | 10/1995 | Jones et al. |

(Continued)

FOREIGN PATENT DOCUMENTS

| CN | 102870181 A | 1/2013 |
| CN | 103004049 A | 3/2013 |

(Continued)

OTHER PUBLICATIONS

Unofficial English translation of Office Action issued in connection with corresponding CN Application No. 201310188777.0 dated Aug. 29, 2016.

(Continued)

*Primary Examiner* — Rexford Barnie
*Assistant Examiner* — Thai Tran
(74) *Attorney, Agent, or Firm* — GE Global Patent Operation; Scott R. Stanley

(57) ABSTRACT

A direct current (DC) circuit breaker for power transmission or distribution system includes a current sensor for sensing current of a system, a controller, a physical switch, and multiple switch modules. The multiple switch modules are electrically coupled to the current sensor and the physical switch in series. Each switch module includes multiple base elements electrically coupled in parallel. Each base element includes a first silicon carbide (SiC) metal-oxide-semiconductor field-effect transistor (MOSFET) and a second SiC MOSFET electrically coupled in an opposite series connection mode. The first and second SiC MOSFETs are configured in a synchronous rectification mode by channel reverse (Continued)

conduction control. The controller controls the multiple switch modules to connect current in the system, and break current of the multiple switch modules according to sensed current signals from the current sensor.

15 Claims, 8 Drawing Sheets

(51) Int. Cl.
*H01H 9/54* (2006.01)
*H01H 33/59* (2006.01)
*H03K 17/12* (2006.01)
*H03K 17/725* (2006.01)

(52) U.S. Cl.
CPC ........... *H02H 3/087* (2013.01); *H03K 17/122* (2013.01); *H03K 17/725* (2013.01); *Y10T 307/747* (2015.04); *Y10T 307/865* (2015.04)

(58) Field of Classification Search
CPC ........ H02H 3/02; H01H 33/596; H01H 9/548; H01H 47/32; Y10T 307/865; Y10T 307/747
USPC .................................................. 361/100, 101
See application file for complete search history.

(56) References Cited

U.S. PATENT DOCUMENTS

| | | | |
|---|---|---|---|
| 5,999,388 A | 12/1999 | Asplund | |
| 6,952,335 B2 | 10/2005 | Huang et al. | |
| 8,004,806 B2 | 8/2011 | Li | |
| 9,042,071 B2 | 5/2015 | Berggren et al. | |
| 9,208,979 B2 | 12/2015 | Haefner et al. | |
| 2003/0183838 A1* | 10/2003 | Huang | H03K 17/08148 257/107 |
| 2006/0238936 A1 | 10/2006 | Blanchard et al. | |
| 2010/0277006 A1 | 11/2010 | Urciuoli | |
| 2011/0025400 A1 | 2/2011 | Rogne | |
| 2011/0267132 A1 | 11/2011 | Lubomirsky et al. | |
| 2012/0182771 A1 | 7/2012 | Trainer et al. | |
| 2012/0199558 A1 | 8/2012 | Faulkner | |
| 2013/0038975 A1* | 2/2013 | Hafner | H01H 33/596 361/93.9 |
| 2014/0029152 A1* | 1/2014 | Mazzola | H03K 17/6871 361/115 |

FOREIGN PATENT DOCUMENTS

| | | |
|---|---|---|
| WO | 2011018113 A1 | 2/2011 |
| WO | 2011050832 A1 | 5/2011 |
| WO | 2011057675 A1 | 5/2011 |
| WO | 2012084693 A1 | 6/2012 |

OTHER PUBLICATIONS

European Search Report and Opinion issued in connection with corresponding EP Application No. 14168486.0-1808 dated Oct. 20, 2014.

Urciuoli et al., "Bi-Directional Scalable Solid-State Circuit Breakers for Hybrid-Electric Vehicles", International Journal of High Speed Electronics and Systems, Issue Date: 2009 , vol. 19, Page No. 183-192.

* cited by examiner

DEVICE AND METHOD TO BREAK THE CURRENT IN POWER TRANSMISSION OR DISTRIBUTION SYSTEM

BACKGROUND

Embodiments of the invention relate generally to devices and methods to break current, and in particular, to direct current (DC) circuit breakers applied in high-voltage direct current (HVDC) systems, medium-voltage direct current (MVDC) power transmission or distribution systems, or the like.

In recent years, the interest in HVDC or MVDC systems has been revived. In those HVDC or MVDC systems, DC circuit breakers are necessary to make the HVDC or MVDC systems more flexible and reliable for many applications such as multi-terminal HVDC grids, MVDC power distribution for subsea electrification, and marine MVDC power transmission and so on. The DC circuit breakers need to be developed and validated at full scale to operate a multi-terminal HVDC or MVDC grid protection for fast interruption time and low loss.

Existing mechanical DC circuit breakers are capable of interrupting HVDC or MVDC currents within several tens of milliseconds, but are too slow to fulfill the requirements of reliable HVDC or MVDC grids. For fulfilling the high speed requirements, several approaches have been investigated. For example, a DC circuit breaker consists of silicon insulated gate bipolar transistors (IGBTs), which are controlled to interrupt HVDC or MVDC currents within a few milliseconds. However, the traditional silicon IGBTs may consume lots of energy during the energy transmission process, which decreases efficiency. Furthermore, due to the silicon IGBTs generating a lot of heat, heat sinks need to be arranged on the silicon IGBTs. This requires additional space and increases the weight of the HVDC or MVDC grids, which in turn reduces their power density and performance.

For these and other reasons, there is a need for providing a new DC circuit breaker at least having capabilities of low conduction loss and faster switching speed.

BRIEF DESCRIPTION

In accordance with an embodiment of the invention, a direct current (DC) circuit breaker having capabilities of low conduction loss and faster switching speed for power transmission or distribution system is provided. The DC circuit breaker includes a current sensor for sensing current of a system, a controller, a physical switch, and multiple switch modules. The multiple switch modules are electrically coupled to the current sensor and the physical switch in series. Each switch module includes multiple base elements electrically coupled in parallel. Each base element includes a first silicon carbide (SiC) metal-oxide-semiconductor field-effect transistor (MOSFET) and a second SiC MOSFET electrically coupled in an opposite series connection mode. The first and second SiC MOSFETs are configured in a synchronous rectification mode by channel reverse conduction control. The controller controls the multiple switch modules to connect current in the system, and break current of the multiple switch modules according to sensed current signals from the current sensor.

In accordance with an embodiment of the invention, a current connecting method for the DC circuit breaker is provided. The current connecting method includes turning on the physical switch at a first time point; turning on the first SiC MOSFET of each base element at a second time point after a predetermined time interval from the first time point; and turning on the second SiC MOSFET of each base element at a third time point after a predetermined time interval from the second time point. The current direction is from the first SiC MOSFET to the second SiC MOSFET of each base element.

In accordance with an embodiment of the invention, a current breaking method for the DC circuit breaker is provided. The current breaking method includes turning off the first SiC MOSFET of each base element at a first time point; turning off the physical switch at a second time point after a predetermined time interval from the first time point; and turning off the second SiC MOSFET of each base element at a third time point after a predetermined time interval from the second time point. The current direction is from the first SiC MOSFET to the second SiC MOSFET of each base element.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Embodiments of the invention relate to a direct current (DC) circuit breaker for power transmission or distribution system. The DC circuit breaker includes a current sensor for sensing current of a system, a controller, a physical switch, and multiple switch modules. The multiple switch modules are electrically coupled to the current sensor and the physical switch in series. Each switch module includes multiple base elements electrically coupled in parallel. Each base element includes a first silicon carbide (SiC) metal-oxide-semiconductor field-effect transistor (MOSFET) and a second SiC MOSFET electrically coupled in an opposite series connection mode. The first and second SiC MOSFETs are configured in a synchronous rectification mode by channel reverse conduction control. The controller controls the multiple switch modules to connect current in the system, and break current of the multiple switch modules according to sensed current signals from the current sensor.

Unless defined otherwise, technical and scientific terms used herein have the same meaning as is commonly understood by one of ordinary skill in the art to which this invention belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items, and terms such as "front", "back", "bottom", and/or "top", unless otherwise noted, are merely used for convenience of description, and are not limited to any one position or spatial orientation. Moreover, the terms "coupled" and "connected" are not intended to distinguish between a direct or indirect coupling/connection between two components. Rather, such components may be directly or indirectly coupled/connected unless otherwise indicated.

Figure 1:
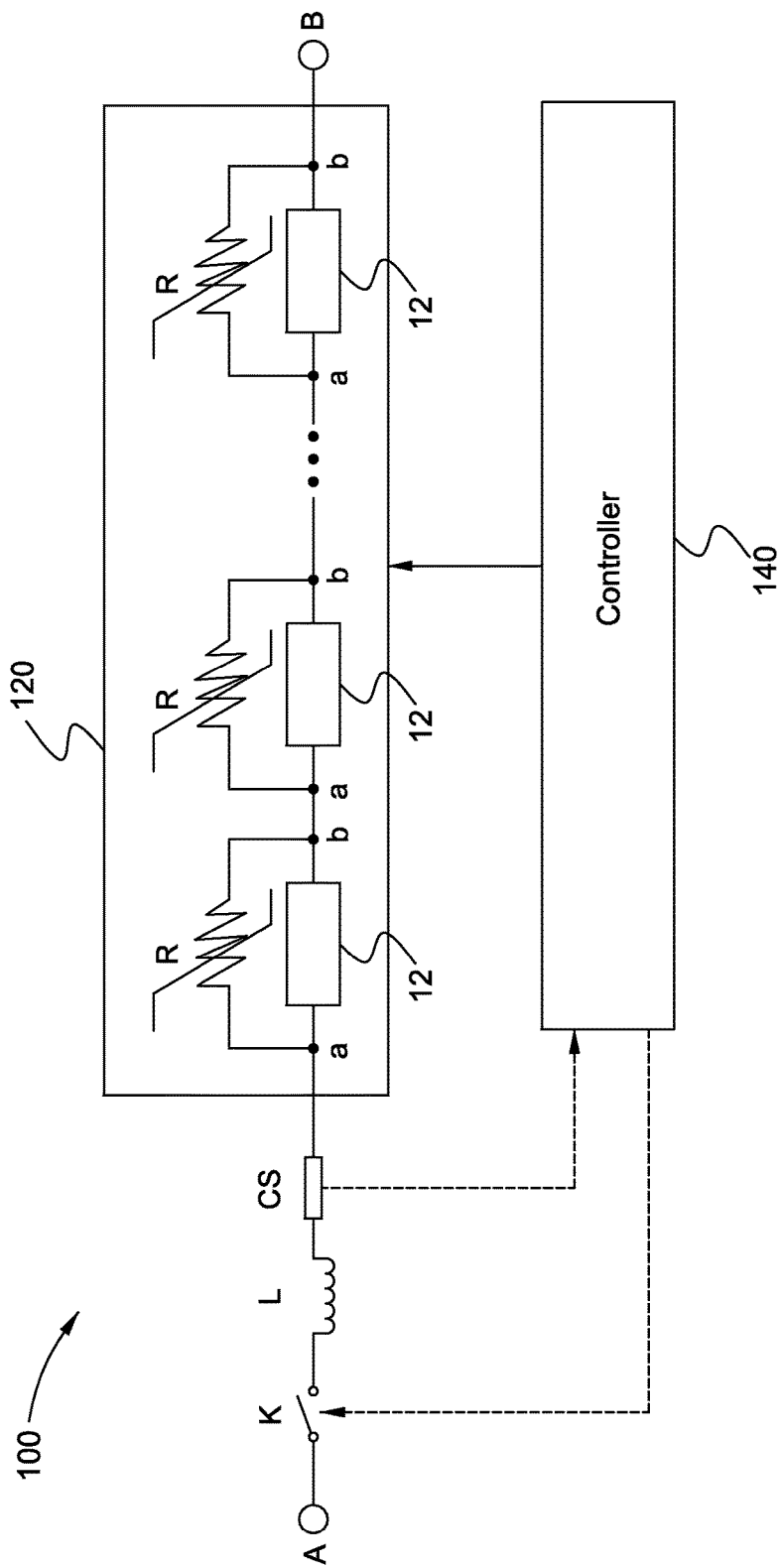
FIG. 1 is a block diagram of a DC circuit breaker according to one embodiment.

Referring to FIG. 1, a block diagram of a DC circuit breaker 100 according to one embodiment is shown. The DC circuit breaker 100 can be applied in any power transmission or distribution systems, such as high-voltage direct current (HVDC) systems, medium-voltage direct current (MVDC) systems, etc., to break current when the current flowing therein is not within a predetermined range or when the power transmission systems fall into some situations which need to quickly cut the current off.

In this illustrated embodiment, the DC circuit breaker 100 includes two terminals 'A' and 'B', a mechanical switch K, a current limiter L, a current sensor CS, a current breaking unit 120, and a controller 140. In one embodiment, the current limiter L is an inductor. The controller 140 may be any type of programmable devices, such as a micro-controller, a micro control unit (MCU), a digital signal processor (DSP), etc.

The two terminals 'A' and 'B' are used to electrically couple the DC circuit breaker 100 into a current transmission line of a power transmission system (not shown). The current sensor CS is used to sense current flowing through the DC circuit breaker 100. The controller 140 is used to receive sensed current signals from the current sensor CS and control the mechanical switch K and the current breaking unit 120 according to the sensed current signals. In a normal working status, the controller 140 switches the mechanical switch K and the current breaking unit 120 on to ensure the current can be transmitted through the DC circuit breaker 100. In an abnormal working status, for example when the sensed current signal is greater than a predetermined maximum value, such as 2 kA, the controller 140 switches the mechanical switch K and the current breaking unit 120 off to interrupt the current flowing through the DC circuit breaker 100. In general, the current breaking unit 120 is used to provide a fast current interruption and the mechanical switch K is used to provide a physical current interruption. In some embodiments, the mechanical switch K also can be controlled manually.

The current breaking unit 120 includes at least one switch module 12 electrically coupled in series. The number of the series-connected switch modules 12 is determined according to the current value flowing through the DC circuit breaker 100. When the current flowing through the DC circuit breaker 100 is getting greater, the number of the series-connected switch modules 12 is getting greater accordingly, and vice versa. Each switch module 12 further electrically couples to a non-linear resistor R in parallel. The non-linear resistor R can help balance the voltage sharing, as well as absorb the fault current breaking energy. Every switch module 12 has a similar function; therefore only one switch module 12 will be described in detail in the following paragraphs.

Figure 2:
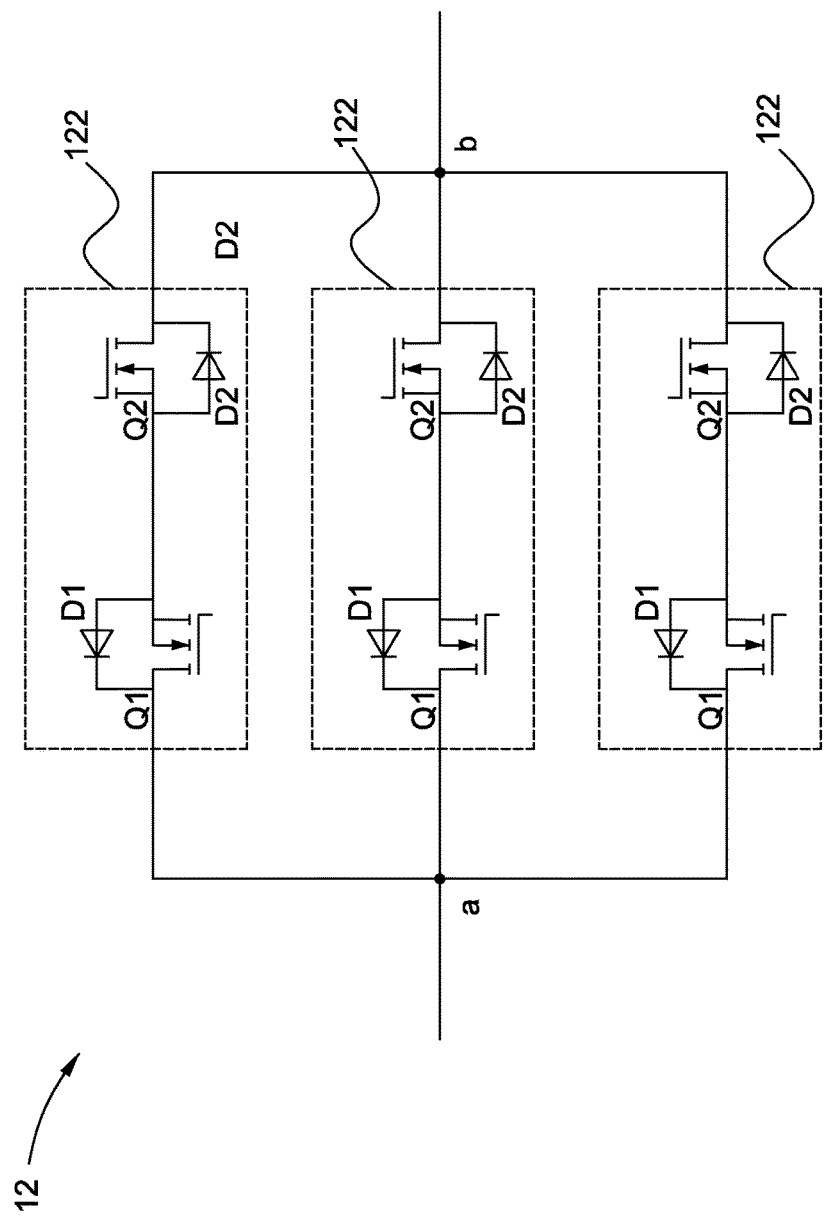
FIG. 2 is a circuit diagram of a switch module of the DC circuit breaker of FIG. 1 according to one embodiment.

Referring to FIG. 2, a circuit diagram of a switch module 12 according to one embodiment is shown. The switch module 12 may include a plurality of base elements 122 electrically coupled in parallel. The number of the parallel-connected base elements 122 is also determined according to the current value flowing through the DC circuit breaker 100. The illustrated embodiment shows an exemplary embodiment which includes three parallel-connected base elements 122. Every base element 122 has a similar function; therefore only one base element 122 will be described in detail in the following paragraphs.

In this illustrated embodiment, the base element 122 includes a first silicon carbide (SiC) metal-oxide-semiconductor field-effect transistor (MOSFET) Q1 and a second SiC MOSFET Q2 electrically coupled in an opposite series connection mode. The first SiC MOSFET Q1 further includes a free-wheeling diode D1. The second SiC MOSFET Q2 further includes a free-wheeling diode D2.

In one embodiment, the drain terminal of the first SiC MOSFET Q1 is connected to a first terminal 'a', the source terminal of the first SiC MOSFET Q1 is connected to the source terminal of the second SiC MOSFET Q2, the gate terminal of the first SiC MOSFET Q1 is used to receive control commands from the controller 140, the cathode of the diode D1 is connected to the drain terminal of the first SiC MOSFET Q1, the anode of the diode D1 is connected to the source terminal of the first SiC MOSFET Q1. The drain terminal of the second SiC MOSFET Q2 is connected to a second terminal 'b', the gate terminal of the second SiC MOSFET Q2 is used to receive control commands from the controller 140, the cathode of the diode D2 is connected to the drain terminal of the second SiC MOSFET Q2, the anode of the diode D2 is connected to the source terminal of the second SiC MOSFET Q2. In other embodiments, there may be more first SiC MOSFETs Q1 connected in series to handle a greater current, or there may be more second SiC MOSFETs Q2 connected in series to handle a greater current. The number of the first SiC MOSFETs Q1 and the number of the second SiC MOSFET Q2 may vary according to actual current requirements. The diode D1 and D2 can either be SiC MOSFET parasitical diodes or external paralleled diodes.

Figure 3:
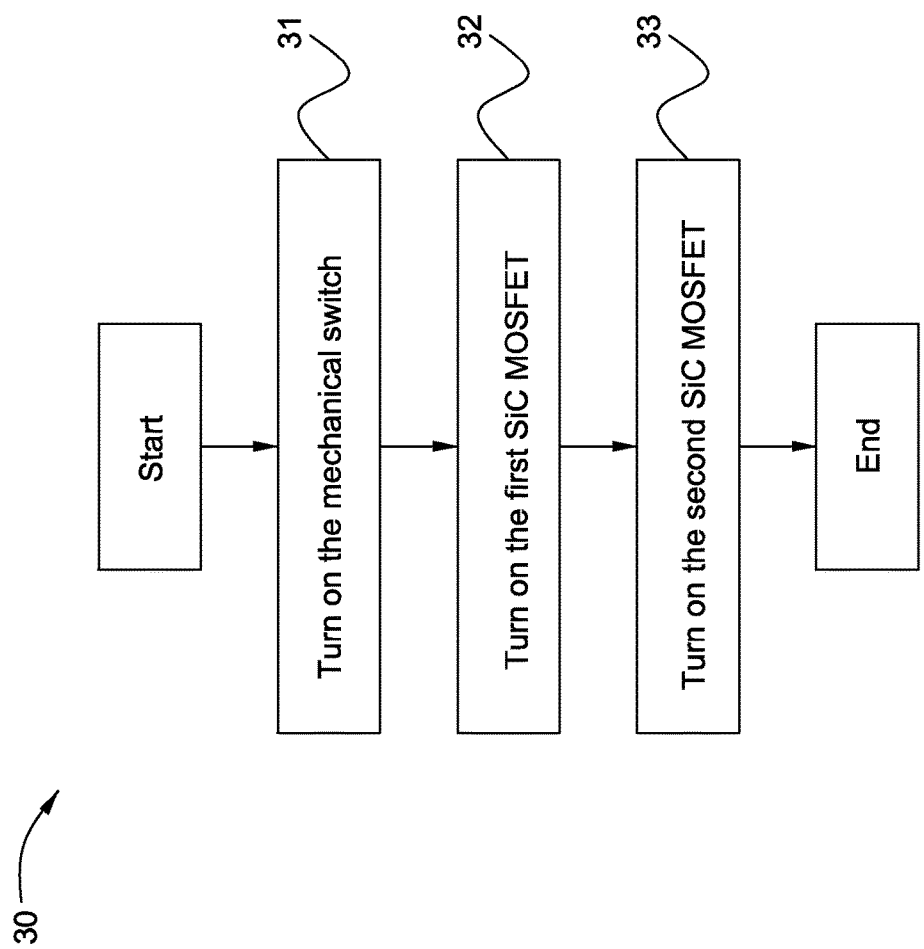
FIG. 3 is a flowchart of a DC current connecting method for the switch modules and a mechanical switch of the DC circuit breaker of FIG. 1 according to one embodiment.

During a startup process of the DC circuit breaker 100, which means to ensure the current can be flowed through the DC circuit breaker 100, the controller 140 outputs control commands to the mechanical switch K and the switch modules 12 according to predetermined programs. The controller 140 outputs those control commands according to a startup signal from the power transmission or distribution system. A flowchart of a DC current connecting method 30 for the switch modules 12 and the mechanical switch K is shown in FIG. 3 as an exemplary embodiment. Herein, the current direction is from the terminal 'A' to 'B'. The DC current connecting method 30 includes the following steps.

Figure 4:
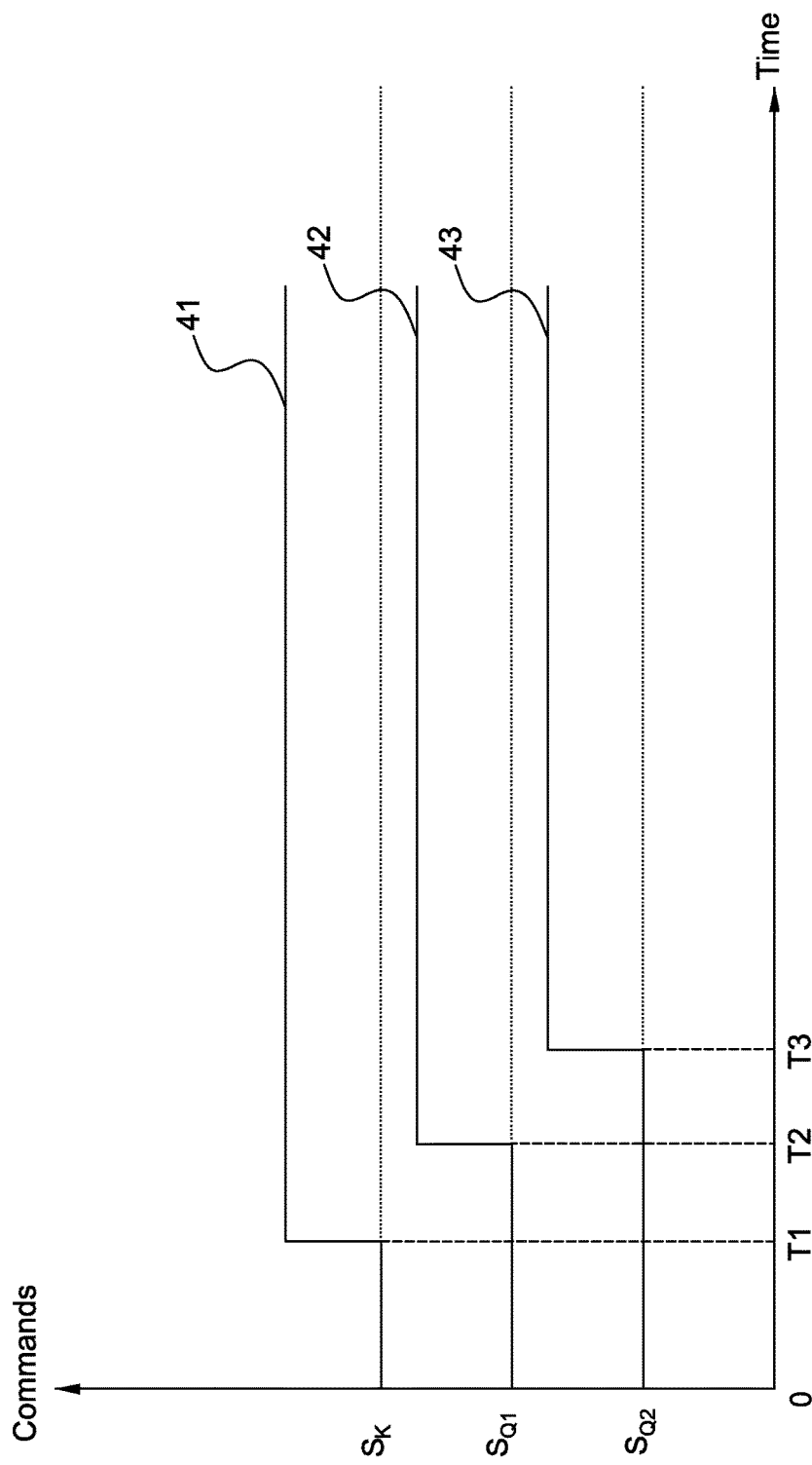
FIG. 4 is a time sequence diagram for showing three switch commands of the DC circuit breaker of FIG. 1 during a current connecting process.
Figure 5:
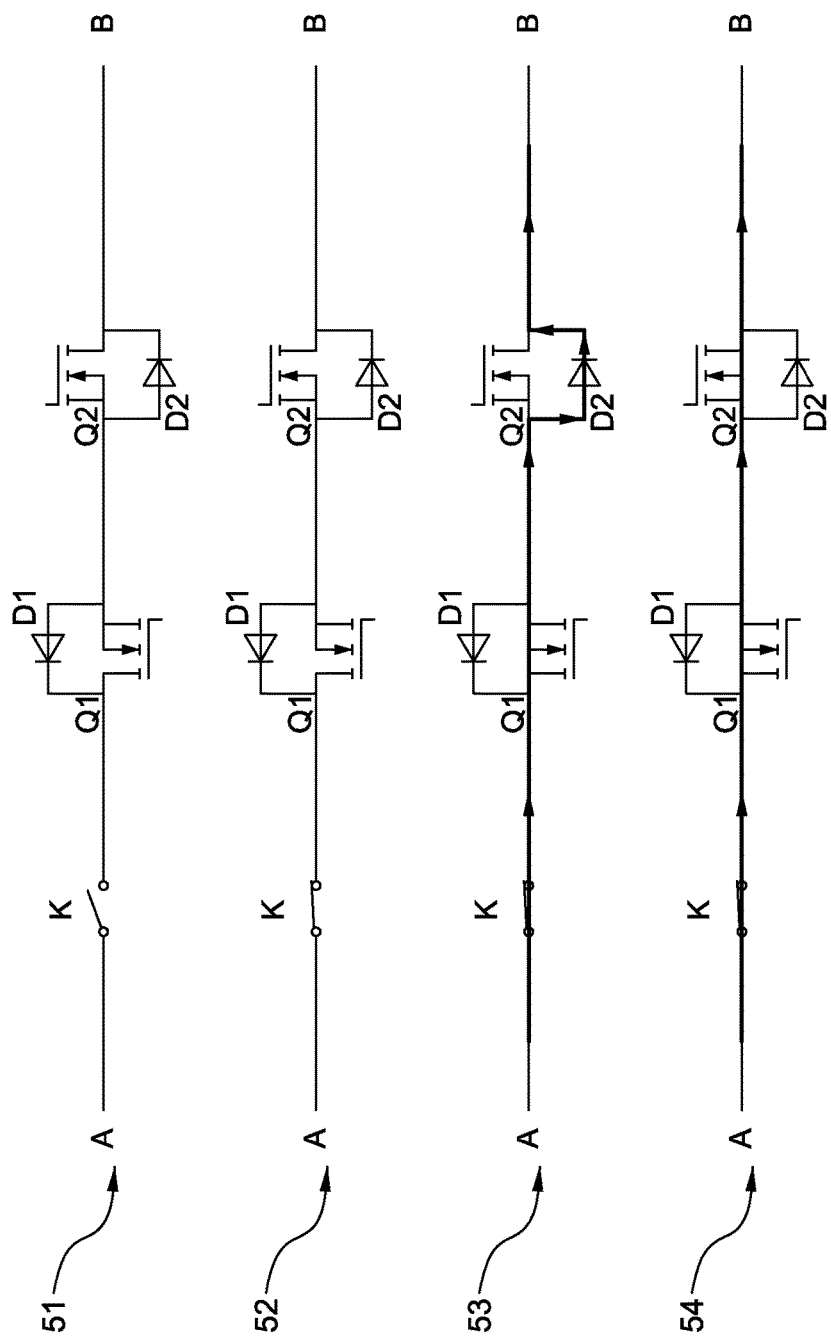
FIG. 5 is a schematic view for showing current flowing statuses in a base element of a switch module and the mechanical switch of the DC circuit breaker of FIG. 1 in four different statuses during the current connecting process.

In step 31, the mechanical switch K is turned on at a first time point T1 according to a control command $S_K$ shown as a command wave 41 in FIG. 4. This mechanical switch K is used to provide a physical connection between the two terminals 'A' and 'B'. In other embodiments, the mechanical switch K may be other types of physical switches. After turning on the mechanical switch K, a physical connection between the two terminals 'A' and 'B' is finished firstly. Referring to FIG. 5, an initial status 51 is shown, and a status 52 of the step 31 is shown. In the initial status 51, the mechanical switch K and the switch modules 12 are opened. In this status 52, the mechanical switch K is turned on, but due to the MOSFETs Q1 and Q2 are not turned on, there is no current flowing through the DC circuit breaker 100 yet.

In step 32, after a predetermined time interval from the first time point T1, such as after about 1 microseconds to 1000 microseconds, all of the first SiC MOSFETs Q1 are turned on at a second time point T2 according to a control command $S_{Q1}$ shown as a command wave 42 in FIG. 4. Referring to FIG. 5, a status 53 of the step 32 is shown. In this status 53, the mechanical switch K is turned on, the first SiC MOSFETs Q1 are turned on as well, but the second SiC MOSFETs Q2 are not turned on yet. Therefore, the current will pass through the mechanical switch K, pass through the first SiC MOSFETs Q1 from the drain terminal to the source terminal thereof, and pass through the diode D2 of the second SiC MOSFETs Q2 (see arrows from 'A' to 'B'). Even though the current can pass through the DC circuit breaker 100, the power loss may be large in the second SiC MOSFETs Q2 because of the diode D2 may consume power greater. However, compared with the conventional Si IGBT configuration, this SiC MOSFET configuration only consumes about 0.2-0.5 times power loss. Furthermore, the switch response speed of the SiC MOSFEF configuration is faster about 5-10 times compared with the conventional Si IGBT configuration.

In step 33, after a predetermined time interval from the second time point T2, such as after about 1 microseconds to 1000 microseconds, all of the second SiC MOSFETs Q2 are turned on at a third time point T3 according to a control command $S_{Q2}$ shown as a command wave 43 in FIG. 4. Referring to FIG. 5, a status 54 of the step 33 is shown. In this status 54, the mechanical switch K is turned on, the first SiC MOSFETs Q1 are turned on, and the second SiC MOSFETs Q2 are turned on as well. Therefore, the current will pass through the mechanical switch K, pass through the first SiC MOSFETs Q1 from the drain terminal to the source terminal thereof, and pass through the second SiC MOSFETs Q2 from the source terminal to the drain terminal thereof (see arrows from 'A' to 'B'). This is due to the SiC MOSFETs having synchronous rectification (SR) mode by a channel reverse conduction control, which can operate current through the SiC MOSFETs along a less loss channel, which may further reduce about 17% power loss after performing this step 33.

In other words, with the positive gate drive signals to the gate terminals of the SiC MOSFETs' Q1 and Q2, each of the SiC MOSFETs Q1 and Q2 can be a reversed channel conduction from the drain terminal to the source terminal or from the source terminal to the drain terminal but not passing through the diodes D1 and D2, which can make the current pass through the less-loss device channel. Therefore, compared with the conventional DC circuit breakers, the SiC MOSFETs Q1 and Q2 will consume less energy during the conduction process. Thus, by using the SiC MOSFETs Q1 and Q2 instead of the conventional semiconductor switches, such as silicon IGBTs, the energy transfer efficiency is increased. Furthermore, because the SiC MOSFETs Q1 and Q2 consume less energy, the heat generated by the SiC MOSFETs Q1 and Q2 is less than the heat generated by the conventional semiconductor switches. Furthermore, the SiC MOSFET can handle higher operation temperature (such as bigger than 175 degrees Celsius). Therefore, the number or volume of the heat sinks (not shown) arranged on the SiC MOSFETs Q1 and Q2 may be less than the number or volume of the heat sinks that are required for a conventional semiconductor switches.

When the current direction is from the terminal 'B' to 'A', the step 32 and step 33 is reversed. In other words, the second SiC MOSFETs Q2 are turned on first and then the first SiC MOSFETs Q1 are turned on.

Figure 6:
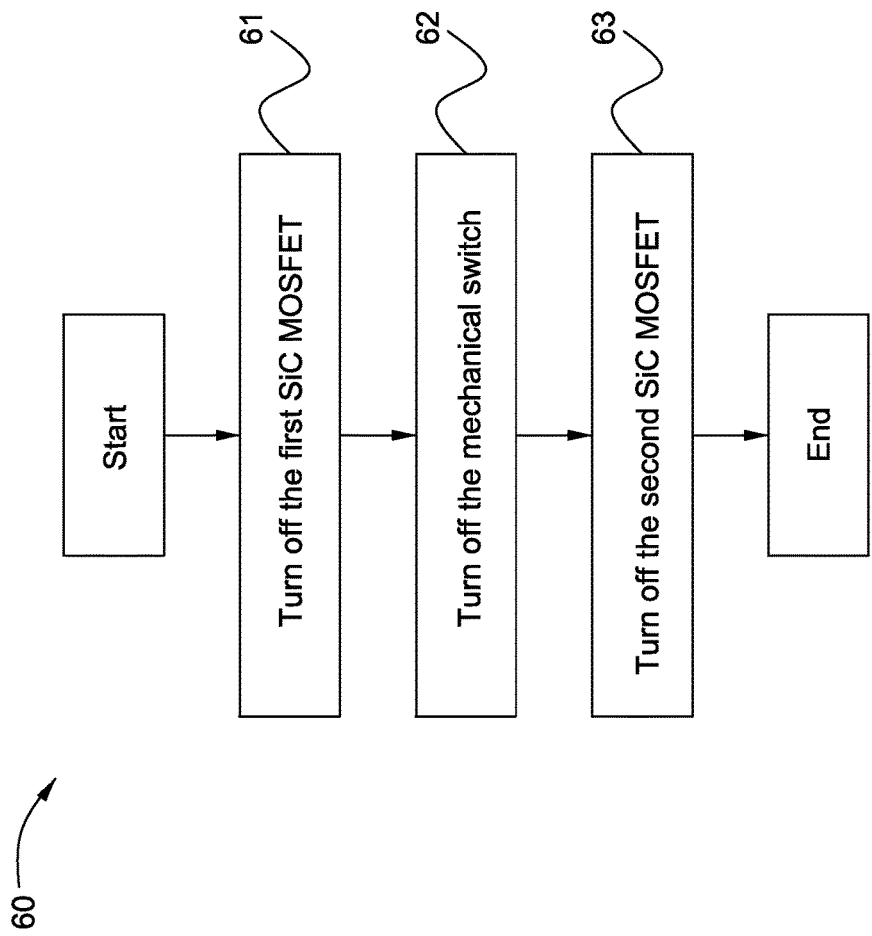
FIG. 6 is a flowchart of a DC current breaking method for the switch modules and the mechanical switch of the DC circuit breaker of FIG. 1 according to one embodiment.

During a current breaking process of the DC circuit breaker 100, which means to interrupt current flowing through the DC circuit breaker 100, the controller 140 outputs control commands to the mechanical switch K and the switch modules 12 according to predetermined programs. The controller 140 outputs those control commands according to the current sensing signals sensed by the current sensor CS, for example when a current sensing signal is greater than a predetermined value. A flowchart of a DC current breaking method 60 for the switch modules 12 and the mechanical switch K is shown in FIG. 6 as an exemplary embodiment. Herein, the current direction is from the terminal 'A' to 'B'. The DC current breaking method 60 includes the following steps.

Figure 7:
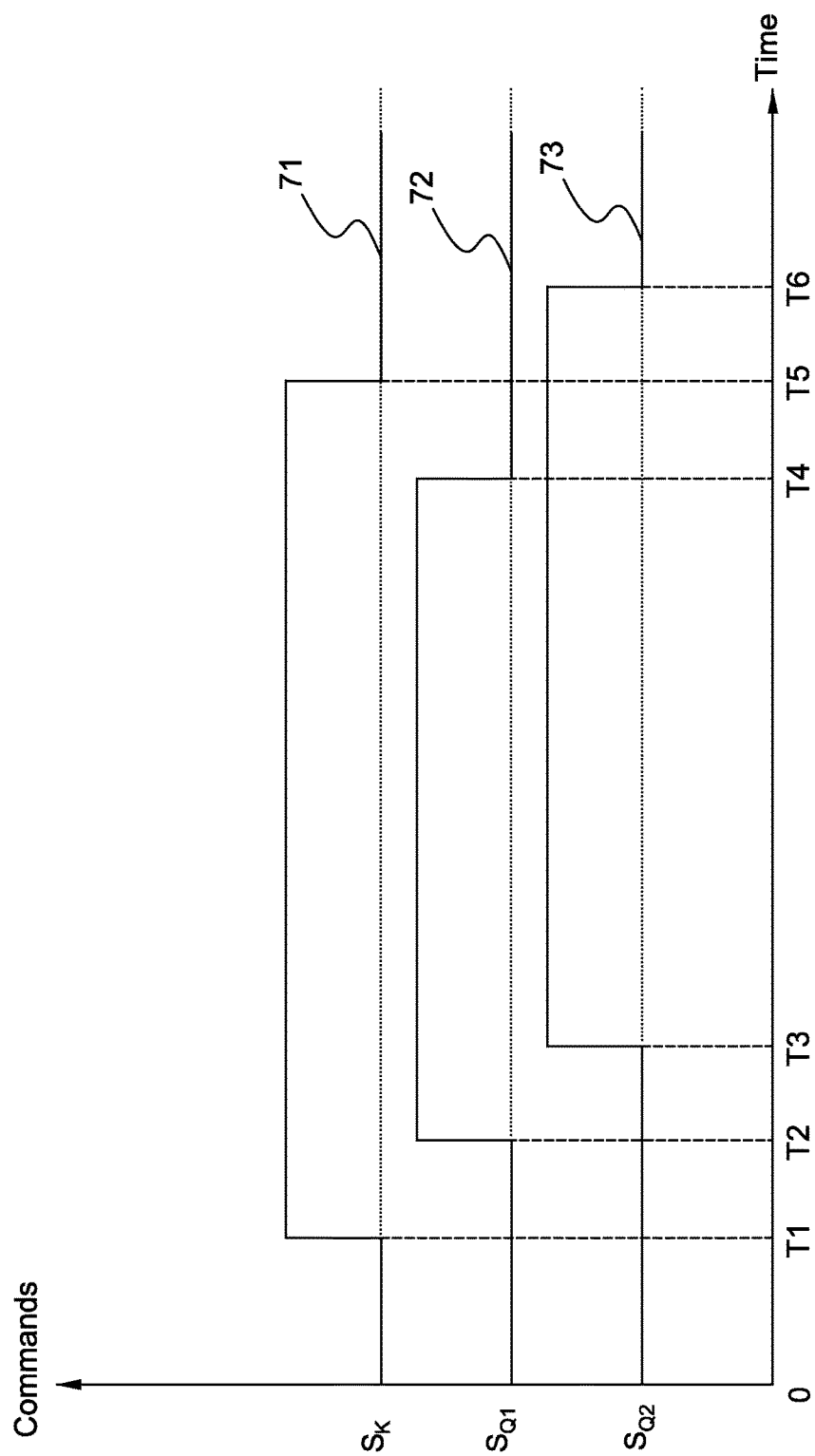
FIG. 7 is a time sequence diagram for showing three switch commands of the DC circuit breaker of FIG. 1 both during a current connecting process and a current breaking process.
Figure 8:
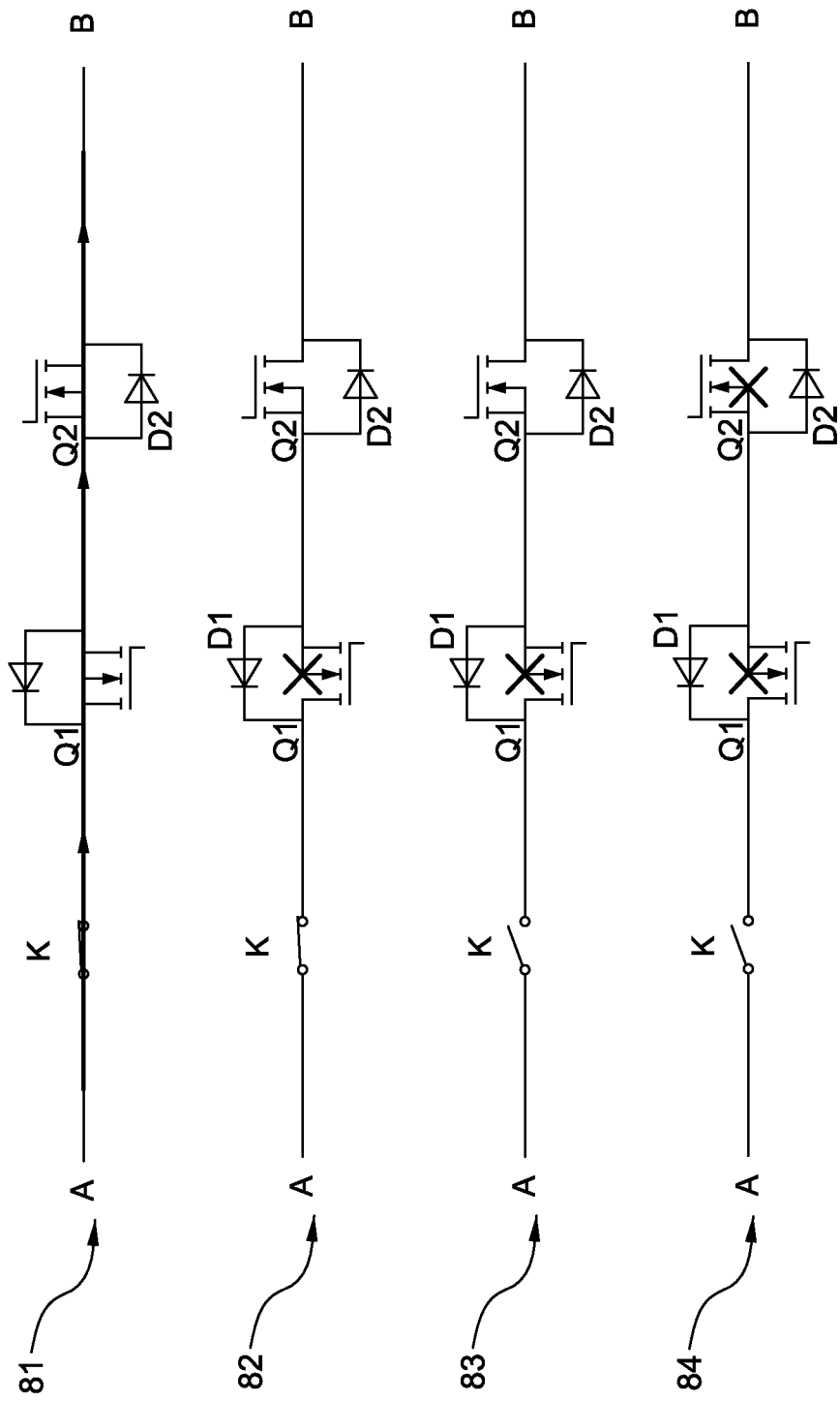
FIG. 8 is a schematic view for showing current flowing statuses in a base element of a switch module and the mechanical switch of the DC circuit breaker of FIG. 1 in four different statuses during the current breaking process.

In step 61, the first SiC MOSFETs Q1 is turned off at a fourth time point T4 according to the control command $S_{Q1}$ shown as a command wave 72 in FIG. 7. Referring to FIG. 8, a normal working status 81 (same as the status 54 shown in FIG. 5) is shown, and a status 82 of the step 61 is shown. In this status 82, the SiC MOSFETs Q1 are turned off, therefore the current is interrupted immediately. Due to the switch time of the SiC MOSFET is very short, may be take only a few milliseconds, which can satisfy the quick switch requirement of the power transmission or distribution system.

In step 62, after a predetermined time interval from the fourth time point T4, such as after about 1 microseconds to 1000 microseconds, the mechanical switch K is turned off at a fifth time point T5 according to the control command $S_K$ shown in FIG. 7. After the mechanical switch K is turned off, the physical connection between the two terminals 'A' and 'B' is cut off. Referring to FIG. 8, a status 83 of the step 62 is shown. In this status 52, the mechanical switch K is turned off, and the first MOSFETs Q1 are turned off.

In step 63, after a predetermined time interval from the fifth time point T5, such as after about 1 microseconds to 1000 microseconds, all of the second SiC MOSFETs Q2 are turned off at a sixth time point T6 according to the control command $S_{Q2}$ showing in FIG. 7. Referring to FIG. 8, a status 84 of the step 63 is shown. In this status 84, the mechanical switch K is turned off, the first SiC MOSFETs Q1 is turned off, and the second SiC MOSFETs Q2 is turned off as well. Therefore, the current connecting points are all cut off finally and back to the initial status 51. When the current fault is gone, the power transmission system can be recovered according to the control performed by the DC current connecting method 30.

When the current direction is from the terminal 'B' to 'A', the step 61 and step 63 is reversed. In other words, the second SiC MOSFETs Q2 is turned off firstly and then the first SiC MOSFETs Q1 is turned off after the mechanical switch K is turned off.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

What is claimed is:

1. A direct current (DC) circuit breaker comprising:
   a current sensor configured to sense current of a system;
   a controller;
   a physical switch electrically coupled to the current sensor in series; and
   a first switch module electrically coupled to the physical switch in series, wherein the first switch module comprises a first base element, the first base element comprises:
      a first silicon carbide (SiC) metal-oxide-semiconductor field-effect transistor (MOSFET); and
      a second SiC MOSFET electrically coupled to the first SiC MOSFET in an opposite series connection mode;
   wherein the controller controls the first and the second SiC MOSFETs to connect current in the system, and break current of the first and the second SiC MOSFETs according to sensed current signals from the current sensor;
   wherein the physical switch is turned on at a first time point, the first SiC MOSFET is turned on at a second time point after the first time point, and the second SiC MOSFET is turned on at a third time point after the second time point.

2. The DC circuit breaker of claim 1, further comprising one or more second switch modules electrically coupled to the first switch module in series, wherein each of the second switch modules has the same configuration with the first switch module.

3. The DC circuit breaker of claim 1, wherein the first switch module further comprises one or more second base elements electrically coupled to the first base element in parallel, wherein each of the second base elements has the same configuration with the first base element.

4. The DC circuit breaker of claim 1, wherein the physical switch is a mechanical switch.

5. The DC circuit breaker of claim 1, wherein the physical switch is controlled by the controller.

6. The DC circuit breaker of claim 1, further comprising a current limiter electrically coupled to the first switch module in series.

7. The DC circuit breaker of claim 6, wherein the current limiter is an inductor.

8. The DC circuit breaker of claim 1, further comprising a non-linear resistor electrically coupled to the first switch module in parallel.

9. The DC circuit breaker of claim 1, wherein the first base element further comprises one or more SiC MOSFETs electrically coupled to the first SiC MOSFET with a same current direction.

10. The DC circuit breaker of claim 1, wherein the first base element further comprises one or more SiC MOSFETs electrically coupled to the second SiC MOSFET with a same current direction.

11. The DC circuit breaker of claim 1, wherein a drain terminal of the first SiC MOSFET is connected to a first terminal, a source terminal of the first SiC MOSFET is connected to a source terminal of the second SiC MOSFET, a cathode of a first diode is connected to the drain terminal of the first SiC MOSFET, an anode of the first diode is connected to the source terminal of the first SiC MOSFET, a drain terminal of the second SiC MOSFET is connected to a second terminal, a cathode of a second diode is connected to the drain terminal of the second SiC MOSFET, an anode of the second diode is connected to the source terminal of the second SiC MOSFET.

12. A current connecting method for a DC circuit breaker, wherein the DC circuit breaker comprises a current sensor configured to sense current of a system, a controller, a physical switch electrically coupled to the current sensor in series, and a first switch module electrically coupled to the physical switch in series, wherein the first switch module comprises a first base element, the first base element comprising a first silicon carbide (SiC) metal-oxide-semiconductor field-effect transistor (MOSFET) and a second SiC MOSFET electrically coupled to the first SiC MOSFET in an opposite series connection mode, and the controller controls the first and the second SiC MOSFETs to connect current in the system, and break current of the first and the second SiC MOSFETs according to sensed current signals from the current sensor, the method comprising:
   turning on the physical switch at a first time point;
   turning on the first SiC MOSFET of the first base element at a second time point after a predetermined time interval from the first time point; and
   turning on the second SiC MOSFET of the first base element at a third time point after a predetermined time interval from the second time point,
   wherein the current direction is from the first SiC MOSFET to the second SiC MOSFET of the first base element.

13. The method of claim 12, wherein the time interval between the first time point and the second time point is about 1 microseconds to 1000 microseconds, the time interval between the second time point and the third time point is about 1 microseconds to 1000 microseconds.

14. A current breaking method for a DC circuit breaker, wherein the DC circuit breaker comprises a current sensor configured to sense current of a system, a controller, a physical switch electrically coupled to the current sensor in series, and a first switch module electrically coupled to the physical switch in series, wherein the first switch module comprises a first base element, the first base element comprising a first silicon carbide (SiC) metal-oxide-semiconductor field-effect transistor (MOSFET) and a second SiC MOSFET electrically coupled to the first SiC MOSFET in an opposite series connection mode, and the controller controls the first and the second SiC MOSFETs to connect current in the system, and break current of the first and the second SiC MOSFETs according to sensed current signals from the current sensor, the method comprising:
   turning off the first SiC MOSFET of the first base element at a first time point;
   turning off the physical switch at a second time point after a predetermined time interval from the first time point; and turning off the second SiC MOSFET of the first base element at a third time point after a predetermined time interval from the second time point, wherein the current direction is from the first SiC MOSFET to the second SiC MOSFET of the first base element.

15. The method of claim 14, wherein the time interval between the first time point and the second time point is about 1 microseconds to 1000 microseconds, the time interval between the second time point and the third time point is about 1 microseconds to 1000 microseconds.

* * * * *